(12) United States Patent
Tachibana

(10) Patent No.: US 9,070,731 B2
(45) Date of Patent: Jun. 30, 2015

(54) COATING FILM FORMING APPARATUS, COATING FILM FORMING METHOD, AND STORAGE MEDIUM

(71) Applicant: TOKYO ELECTRON LIMITED, Tokyo (JP)

(72) Inventor: Kouzou Tachibana, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/553,496

(22) Filed: Nov. 25, 2014

(65) Prior Publication Data

US 2015/0155197 A1    Jun. 4, 2015

(30) Foreign Application Priority Data

Dec. 3, 2013    (JP) .................................. 2013-250254

(51) Int. Cl.

| H01L 21/687 | (2006.01) |
|---|---|
| B05C 11/08 | (2006.01) |
| B05C 5/00 | (2006.01) |
| B05C 11/10 | (2006.01) |
| H01L 21/02 | (2006.01) |
| H01L 21/67 | (2006.01) |
| H01L 21/673 | (2006.01) |

(52) U.S. Cl.
CPC .......... *H01L 21/68721* (2013.01); *B05C 11/08* (2013.01); *B05C 5/00* (2013.01); *B05C 11/1013* (2013.01); *H01L 21/02282* (2013.01); *H01L 21/6715* (2013.01); *H01L 21/67326* (2013.01)

(58) Field of Classification Search
CPC ................................. H01L 21/27; B05D 1/005
See application file for complete search history.

(56) References Cited

U.S. PATENT DOCUMENTS

| 6,132,802 | A | * | 10/2000 | Davis et al. .................... 438/758 |
|---|---|---|---|---|
| 7,566,365 | B2 | * | 7/2009 | Kobayashi et al. ............. 118/52 |
| 8,256,370 | B2 | * | 9/2012 | Kitano et al. ................... 118/52 |
| 8,808,798 | B2 | * | 8/2014 | Kitano et al. .................. 427/240 |
| 8,871,301 | B2 | * | 10/2014 | Tachibana et al. ............ 427/240 |
| 2004/0180142 | A1 | * | 9/2004 | Kobayashi et al. ........... 427/240 |
| 2005/0181127 | A1 | * | 8/2005 | Hamada et al. ............... 427/240 |
| 2007/0051393 | A1 | * | 3/2007 | Cho et al. ...................... 134/149 |
| 2007/0071890 | A1 | * | 3/2007 | Yoshihara et al. ............ 427/240 |
| 2008/0057219 | A1 | * | 3/2008 | Kim et al. ..................... 427/534 |

(Continued)

FOREIGN PATENT DOCUMENTS

JP    2005-235950 A    9/2005

*Primary Examiner* — Savitr Mulpuri
(74) *Attorney, Agent, or Firm* — Nath, Goldberg & Meyer; Jerald L. Meyer; Katelyn J. Bernier

(57) ABSTRACT

A coating film forming apparatus includes a substrate holding unit, a ring-shaped member annularly installed along a circumferential direction of the substrate so as to cover an upper side of a peripheral edge portion of the substrate, and a control unit that outputs a control signal so as to perform: positioning the ring-shaped member at a processing position where an air flow flowing above the peripheral edge portion of the substrate is straightened; rotating the substrate at a first revolution number such that a coating liquid supplied to a central portion of the substrate is diffused toward the peripheral edge portion by a centrifugal force; bringing the ring-shaped member to a retreated position where an air flow flowing near a front surface of the substrate is prevented from becoming turbulent; and reducing the revolution number of the substrate to a second revolution number lower than the first revolution number.

4 Claims, 10 Drawing Sheets

(56) References Cited

U.S. PATENT DOCUMENTS

| | | | |
|---|---|---|---|
| 2008/0092813 A1* | 4/2008 | Nakashima et al. | 118/712 |
| 2013/0152976 A1* | 6/2013 | Amano | 134/26 |
| 2013/0156948 A1* | 6/2013 | Amano | 427/240 |
| 2014/0116478 A1* | 5/2014 | Higashijima et al. | 134/104.2 |
| 2014/0116480 A1* | 5/2014 | Higashijima et al. | 134/153 |
| 2014/0238443 A1* | 8/2014 | Lee et al. | 134/21 |
| 2014/0261163 A1* | 9/2014 | Kishita et al. | 118/52 |
| 2015/0004311 A1* | 1/2015 | Ichino et al. | 427/240 |

* cited by examiner

COATING FILM FORMING APPARATUS, COATING FILM FORMING METHOD, AND STORAGE MEDIUM

CROSS-REFERENCE TO RELATED APPLICATION

This application claims the benefit of Japanese Patent Application No. 2013-250254, filed on Dec. 3, 2013, in the Japan Patent Office, the disclosure of which is incorporated herein in its entirety by reference.

TECHNICAL FIELD

The present disclosure relates to a coating film forming apparatus for forming a coating film on a substrate, a coating film forming method, and a non-transitory storage medium including a computer program used in the coating film forming apparatus.

BACKGROUND

When forming a coating film, e.g., a resist film, on a substrate, a method called spin coating is extensively used in that the spin coating can rapidly form the coating film. In the spin coating, the rear surface of a substrate is held in a spin chuck and a resist is supplied to a central portion of a front surface of the substrate. Then, the resist is diffused toward the peripheral edge portion of the substrate with a centrifugal force by rotating the substrate. A film is formed by drying the resist thus diffused.

In order to rapidly dry the resist, it is conceivable to increase the revolution number of the substrate to thereby accelerate volatilization of a solvent existing in the resist. However, the Reynolds number of an air flow on the substrate grows higher as the revolution number of the substrate becomes larger. If the Reynolds number exceeds a threshold value, the air flow on the substrate becomes a turbulent flow. Then, the turbulent air flow is transferred to the surface of a resist film. That is to say, coating spots, i.e., irregularities corresponding to the air flow are formed in the resist film. Consequently, the in-plane uniformity of a film thickness is reduced.

A semiconductor wafer (hereinafter referred to as a "wafer") as a substrate is becoming larger in size. Use of a wafer having a diameter of, e.g., 450 mm, has been studied. If the wafer becomes larger in this way, the upper limit of the revolution number at which the generation of coating spots in the peripheral edge portion of the wafer can be suppressed becomes lower. In order to ensure that the coating spots are not generated even when the revolution number is made larger, studies have been made in which a baffle plate having a ring shape is installed on the wafer to prevent air flow from becoming turbulent at the lower surface side of the baffle plate.

In the meantime, it has been studied to perform formation of a resist film such that the amount of a resist supplied to a wafer becomes smaller. If the aforementioned baffle plate is installed when forming the resist film, as set forth in the evaluation tests to be described later, the film thickness of a peripheral end portion within the plane of the wafer becomes smaller than the film thickness of the remaining portion. As a result, there may be a case where the in-plane uniformity of a film thickness is reduced. In the related art, there has been proposed a technology, according to which a ring-shaped plate is installed above a square substrate so as to face the corner portions of the square substrate, thereby straightening an air flow on the substrate on which a resist is coated in the aforementioned manner. However, this technology does not mention the aforementioned problem and the solution to the problem.

SUMMARY

Some embodiments of the present disclosure seek to rapidly form a coating film on a substrate and to increase the uniformity of a film thickness of the coating film within the plane of the substrate.

According to an aspect of the present disclosure, there is provided a coating film forming apparatus, including: a substrate holding unit configured to horizontally hold a substrate; a rotating mechanism configured to rotate the substrate held in the substrate holding unit; a coating liquid supply mechanism configured to supply a coating liquid to a central portion of the substrate; a ring-shaped member annularly installed along a circumferential direction of the substrate so as to cover an upper side of a peripheral edge portion of the substrate; an elevator mechanism configured to relatively move the ring-shaped member up and down with respect to the substrate holding unit; and a control unit. The control unit is configured to output a control signal so as to perform: positioning the ring-shaped member at a processing position where an air flow flowing above the peripheral edge portion of the substrate is straightened; rotating the substrate at a first revolution number such that the coating liquid supplied to the central portion of the substrate is diffused toward the peripheral edge portion by a centrifugal force; bringing the ring-shaped member to a retreated position by moving the ring-shaped member upward with respect to the substrate, the retreated position being a position where an air flow flowing near a front surface of the substrate is prevented from becoming turbulent due to a reduction in the revolution number of the substrate; and reducing the revolution number of the substrate to a second revolution number lower than the first revolution number.

According to another aspect of the present disclosure, there is provided a coating film forming method including: horizontally holding a substrate with a substrate holding unit; positioning a ring-shaped member at a processing position where an air flow flowing above a peripheral edge portion of the substrate is straightened, the ring-shaped member annularly installed along a circumferential direction of the substrate so as to cover an upper side of the peripheral edge portion of the substrate; supplying a coating liquid to a central portion of the substrate; in a state in which the ring-shaped member is positioned at the processing position, rotating the substrate held in the substrate holding unit at a first revolution number by a rotating mechanism such that the coating liquid supplied to the central portion of the substrate is diffused toward the peripheral edge portion of the substrate by a centrifugal force; bringing the ring-shaped member to a retreated position by moving the ring-shaped member upward from the processing position with respect to the substrate by an elevator mechanism, the retreated position being a position where an air flow flowing near a front surface of the substrate is prevented from becoming turbulent due to a change in the revolution number of the substrate; and reducing the revolution number of the substrate to a second revolution number lower than the first revolution number.

According to another aspect of the present disclosure, there is provided a non-transitory computer-readable storage medium which stores a computer program for use in a coating film forming apparatus for forming a coating film on a substrate, wherein the program incorporates instructions for executing the aforementioned coating film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
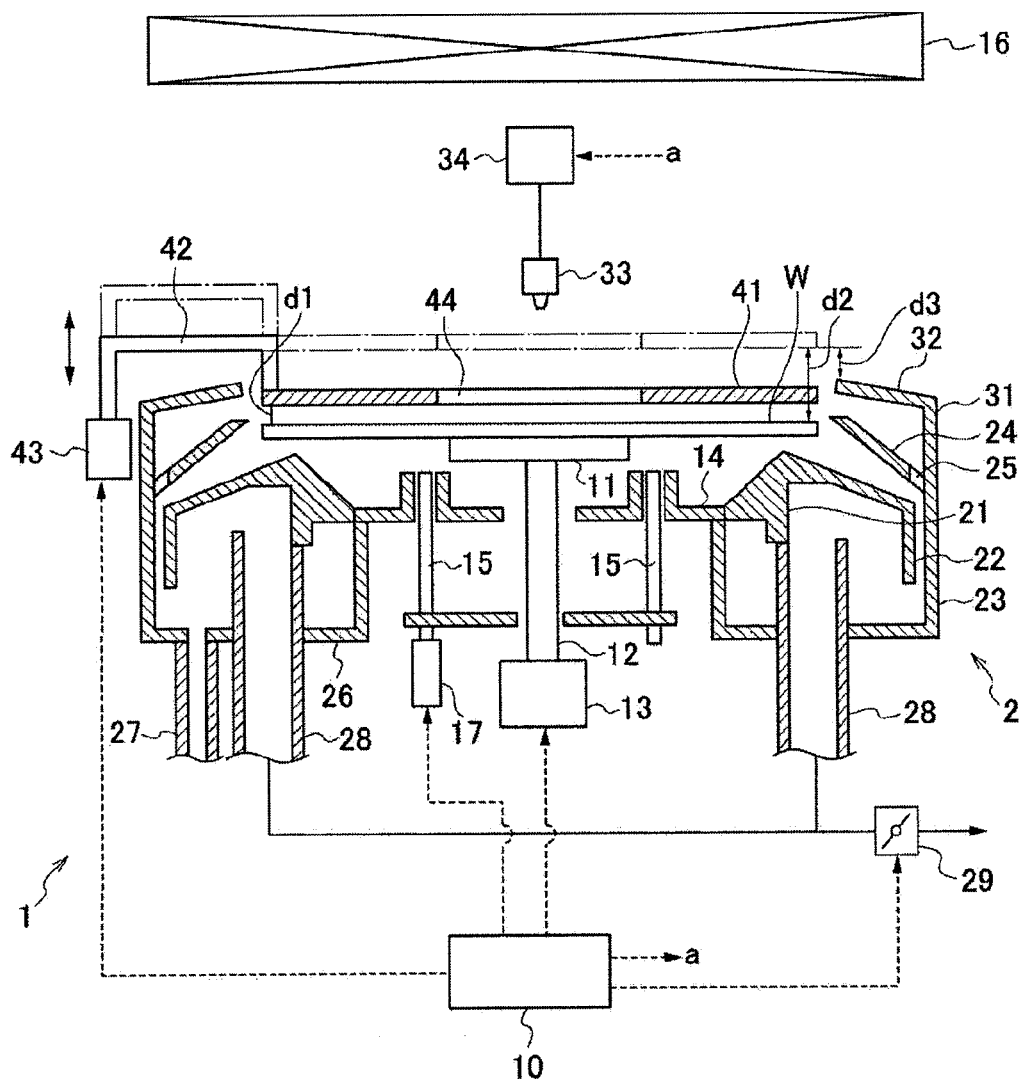
FIG. 1 is a vertical sectional view of a resist coating apparatus.
Figure 2:
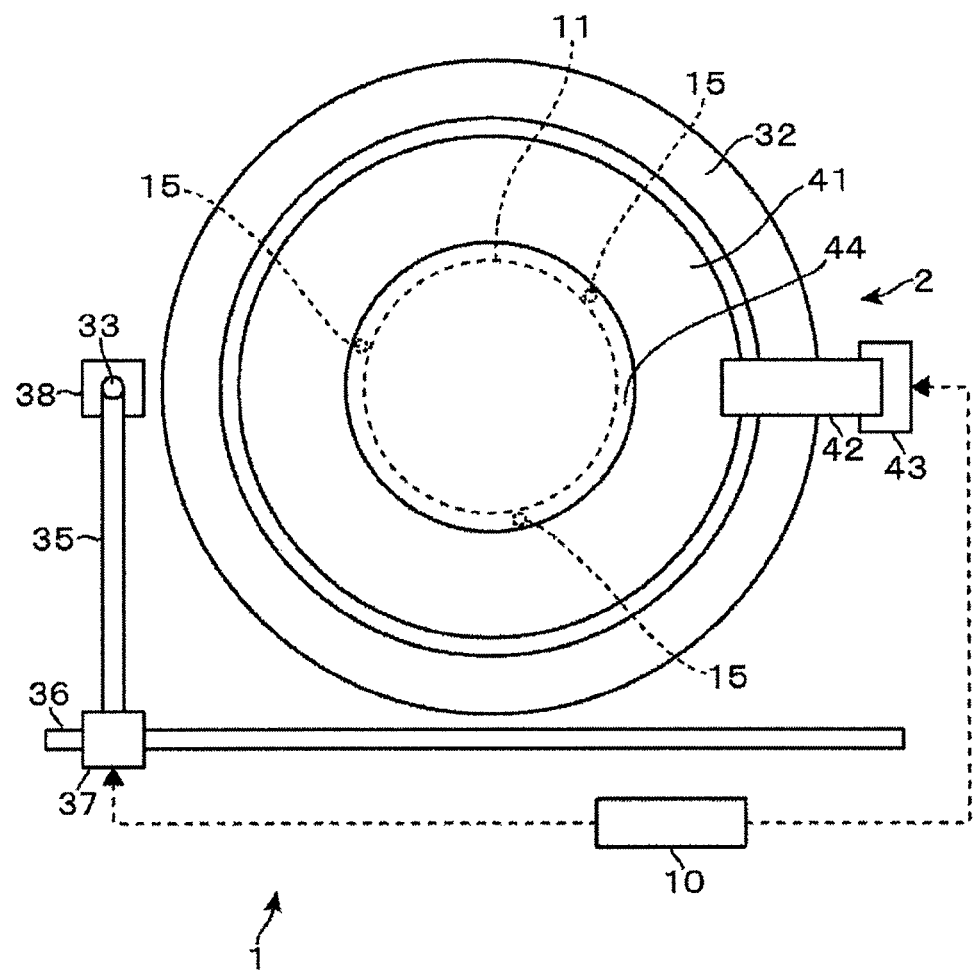
FIG. 2 is a plane view of the resist coating apparatus.

A resist coating apparatus 1 which is one embodiment of a coating film forming apparatus of the present disclosure and which is configured to form a resist film by supplying a resist to a semiconductor wafer (hereinafter referred to as a "wafer") W as a substrate will now be described with reference to the vertical sectional view of FIG. 1 and the plane view of FIG. 2. The resist coating apparatus 1 includes a spin chuck 11 as a substrate holding unit that horizontally holds the wafer W by vacuum-sucking a central portion of a rear surface of the wafer W. The spin chuck 11 is connected at the lower side thereof to a rotary drive unit 13 as a rotating mechanism through a shaft portion 12 and can be rotated about a vertical axis by the rotary drive unit 13.

At the lower side of the spin chuck 11, a circular plate 14 is installed so as to surround the shaft portion 12. Three lifter pins 15 move up and down through holes formed in the circular plate 14 (only two lifter pins 15 are shown in FIG. 1). The resist coating apparatus 1 can give and receive the wafer W between an external transfer mechanism and the spin chuck 11. In FIG. 1, reference symbol 17 designates a pin elevator mechanism that moves the lifter pins 15 up and down.

A cup 2 is installed so as to surround the spin chuck 11. The cup 2 receives a waste liquid scattering or flowing down from the rotating wafer W and guides the waste liquid to discharge the same out of the resist coating apparatus 1. The cup 2 includes a chevron-shaped guide portion 21 annularly installed around the circular plate 14. The chevron-shaped guide portion 21 serves to guide the liquid flowing down from the wafer W to the outer lower side of the wafer W. The cross section of the guide portion 21 is formed into a chevron shape. An annular vertical wall 22 is installed to extend downward from an outer peripheral end portion of the chevron-shaped guide portion 21.

The cup 2 includes a vertical cylindrical portion 23 surrounding the outer side of the chevron-shaped guide portion 21 and an upper guide portion 24 obliquely extending inward and upward from an upper edge of the cylindrical portion 23. In the upper guide portion 24, a plurality of openings 25 is formed along a circumferential direction. The lower side of the cylindrical portion 23 is formed into a trough shape, thereby forming an annular liquid receiving portion 26 at the lower side of the chevron-shaped guide portion 21. A liquid drain path 27 is connected to the liquid receiving portion 26. An exhaust pipe 28 is installed in such a fashion as to protrude into the liquid receiving portion 26 from below. An exhaust damper 29 for adjusting an exhaust flow rate is installed in the exhaust pipe 28. A sensor (not shown) for measuring an exhaust pressure is installed in the exhaust pipe 28. In response to a signal transmitted from the sensor, a control unit 10 to be described later adjusts an opening degree of the exhaust damper 29, thereby regulating the exhaust flow rate.

A vertical cylindrical portion 31 is installed to extend upward from a base end portion of the upper guide portion 24. A slant wall 32 is installed so as to extend inward and upward from the upper edge of the cylindrical portion 31. The liquid scattered from the wafer W due to the rotation of the wafer W can be received by the slant wall 32, the upper guide portion 24 and the cylindrical portions 23 and 31. The liquid thus received is guided toward the outer lower side of the wafer W and is introduced into the liquid drain path 27. A fan filter unit 16 is installed above the cup 2. During the course of processing the wafer W, a clean gas is supplied from the fan filter unit 16 toward the cup 2 and the inside of the cup 2 is evacuated through the exhaust pipe 28.

A resist nozzle 33 is installed in the resist coating apparatus 1. The resist nozzle 33 is connected to a resist supply source 34. As shown in FIG. 2, the resist nozzle 33 is installed at the tip of an arm 35. A base end portion of the arm 35 is connected to a moving mechanism 37 that can move the arm 35 up and down and can horizontally move the arm 35 along a guide 36. The resist nozzle 33 can be moved by the moving mechanism 37 between a specified position existing above the wafer W and a standby region 38 existing outside the cup 2.

The resist coating apparatus 1 includes a ring plate 41 as a baffle member. The ring plate 41 is formed as a circular flat ring-shaped member. The ring plate 41 is disposed along the peripheral edge portion of the wafer W so as to cover the peripheral edge portion of the wafer W held in the spin chuck 11. The ring plate 41 is horizontally supported by a support member 42. The support member 42 is connected to an elevator mechanism 43. The elevator mechanism 43 moves the ring plate 41 between a retreated position indicated by a chain line in FIG. 1 and a processing position indicated by a solid line in FIG. 1.

The processing position refers to a position of the ring plate 41 where the resist is diffused toward the peripheral edge portion of the wafer W by rotating the wafer W at a relatively high revolution number as will be described later and where the resist is dried. More specifically, the processing position is the position where an air flow flowing between the wafer W and the ring plate 41 is prevented from becoming turbulent. In the processing position, the spaced-apart distance d1 (see FIG. 1) between the lower surface of the ring plate 41 and the front surface of the wafer W is, e.g., 5 mm or less. In this example, the spaced-apart distance d1 is set to 2 mm.

The retreated position refers to a position where, when the revolution number of the wafer W is reduced in order to adjust the film thickness distribution of a resist after the resist is coated on the entire front surface of the wafer W, an air flow flowing near the front surface of the wafer W is prevented from becoming turbulent due to the reduction of the revolution number. In the retreated position, the spaced-apart distance d2 between the lower surface of the ring plate 41 and the front surface of the wafer W is, e.g., 150 mm or more. In the retreated position, the spaced-apart distance d3 between the lower surface of the ring plate 41 and the upper end portion of the cup 2 is, e.g., 110 mm or more.

Reference symbol 44 designates an opening formed inside the ring plate 41. The opening 44 is formed into a circular shape. When the wafer W rotates and when the surrounding of the wafer W becomes a negative pressure atmosphere, a gas is introduced from the upper side of the opening 44 toward the surrounding of the wafer W through the opening 44. The introduction of the gas prevents air flow flowing around the wafer W from becoming turbulent due to the formation of the negative pressure atmosphere.

The center of the opening 44 and the center of the ring plate 41 are positioned on the rotation axis of the spin chuck 11. The diameter of the wafer W is, e.g., 450 mm. In this case, the diameter of the opening 44 is, e.g., 150 mm to 300 mm. In this example, the diameter of the opening 44 is 200 mm.

A control unit 10 as a computer is installed in the resist coating apparatus 1. In the control unit 10, there is installed a program which is stored in a storage medium such as, e.g., a flexible disk, a compact disk, a hard disk, a MO (magneto-optical) disk or a memory card. The installed program incorporates commands (individual steps) so as to transmit control signals to the respective parts of the resist coating apparatus 1 to thereby control the operations of the respective parts. Specifically, the program controls operations such as a change in the revolution number of the wafer W performed by the rotary drive unit 13, the movement of the resist nozzle 33, the supply and cutoff of the resist supplied from the resist supply source 34 to the resist nozzle 33, the up/down movement of the ring plate 41, and the adjustment of the exhaust flow rate performed by the exhaust damper 29.

Next, the processing performed by the aforementioned resist coating apparatus 1 will be described with reference to FIGS. 3 to 8, which are process diagrams showing the operation of the resist coating apparatus 1. The timing chart shown in FIG. 9 will also be appropriately referred to. In the timing chart, the change in revolution number of the wafer W is indicated by a solid line and the spaced-apart distance between the front surface of the wafer W and the lower surface of the ring plate 41 (hereinafter also referred to as a "spaced-apart distance") is indicated by a chain line. In the timing chart, the numerical value of the horizontal axis denotes the time (unit: second) elapsed from a predetermined time point. The resist coating apparatus 1 performs the processing in such a way that the reduction in the film thickness in the peripheral end portion of the wafer W is suppressed even when the amount of the resist supplied to the wafer W is relatively small and that a resist film having a film thickness highly uniform within the plane of the wafer W can be performed.

A gas is supplied from the fan filter unit 16 to the cup 2. The inside of the cup 2 is evacuated through the exhaust pipe 28. The ring plate 41 is positioned in a standby position. In this state, the wafer W is transferred to the resist coating apparatus 1 by a transfer mechanism not shown. The wafer W is delivered to the spin chuck 11 by the lifter pins 15. If the central portion of the rear surface of the wafer W is sucked and held by the spin chuck 11, the ring plate 41 is moved down and is stopped just above the processing position. At this time, the spaced-apart distance between the front surface of the wafer W and the lower surface of the ring plate 41 becomes equal to 5 mm or more, e.g., 10 mm to 20 mm, such that the resist splashed from the wafer W is prevented from adhering to the lower surface of the ring plate 41 and such that the ring plate 41 can rapidly move to the processing position. The wafer W is rotated at a coating-liquid-supplying revolution number of 800 rpm to 2500 rpm, e.g., 1500 rpm. The exhaust flow rate is controlled such that the exhaust pressure of the exhaust pipe 28 becomes equal to 130 Pa. The resist nozzle 33 is moved from the standby region 38 to above the central portion of the wafer W.

Figure 3:
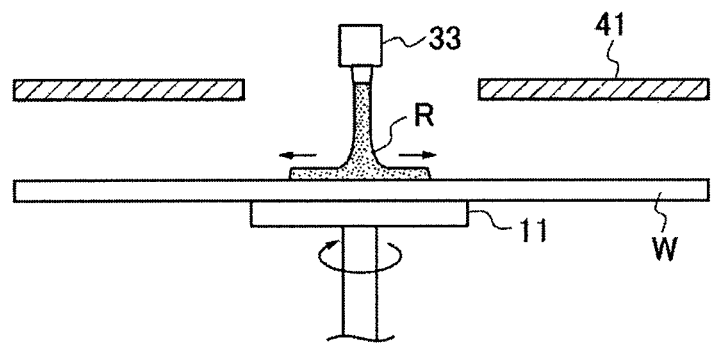
FIG. 3 is a process diagram of wafer processing performed by the resist coating apparatus.
Figure 4:
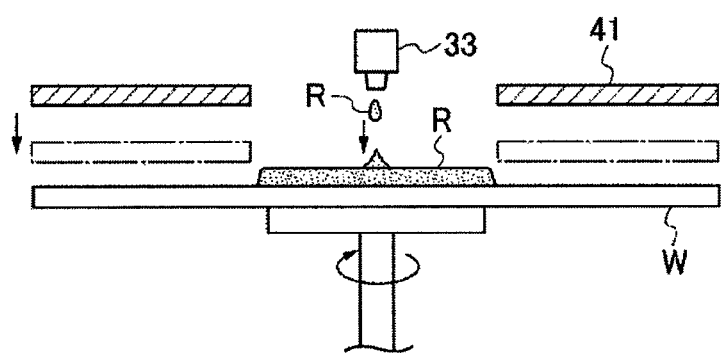
FIG. 4 is a process diagram of wafer processing performed by the resist coating apparatus.
Figure 9:
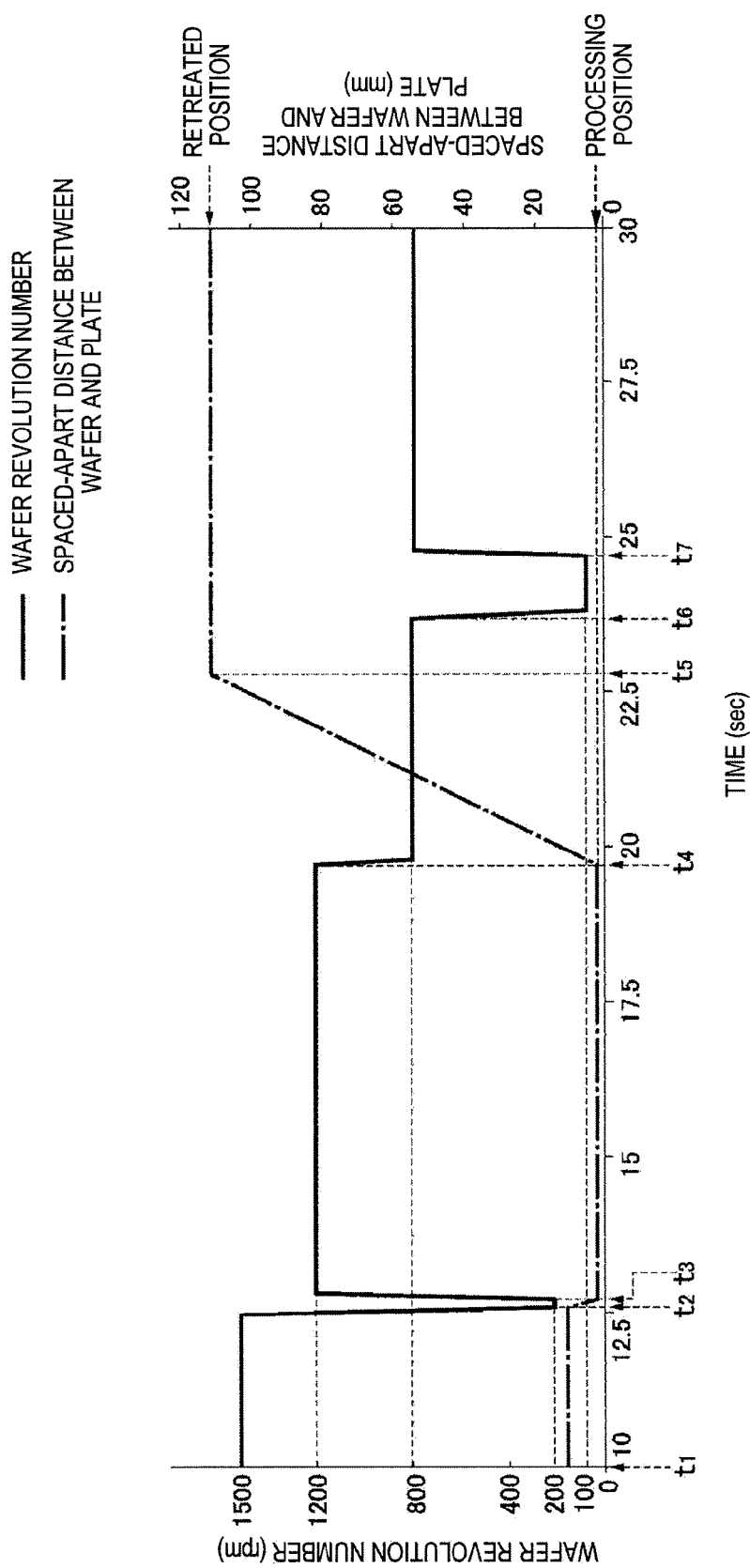
FIG. 9 is a time chart illustrating a change in the revolution number of a wafer and a change in the height of a ring plate during the wafer processing.

A resist R is injected from the resist nozzle 33 toward the central portion of the wafer W (time t1 in FIG. 9). The resist R thus injected is diffused toward the peripheral edge portion of the wafer W by a centrifugal force (FIG. 3). If a predetermined amount of the resist R is injected, the injection is stopped. The revolution number of the wafer W is reduced to a liquid-pool-forming revolution number of 100 rpm to 500 rpm, e.g., 200 rpm. The ring plate 41 is moved down to the processing position (time t2 and FIG. 4). Due to the reduction in the revolution number, the diffusion speed of the resist R on the wafer W is reduced and a liquid pool of the resist R is formed in the central portion of the wafer W. Liquid droplets of the resist R dropping from the resist nozzle 33 are well mixed with the liquid pool. Thus, the generation of coating spots attributable to the droplets is suppressed.

The resist nozzle 33 comes back to the standby region 38. The revolution number of the wafer W is increased to a first revolution number of 800 rpm to 1300 rpm, e.g., 1200 rpm. The exhaust flow rate is reduced such that the exhaust pressure becomes equal to, e.g., 20 Pa (time t3). In this example, the exhaust flow rate is controlled such that the exhaust pressure is kept at 20 Pa until the processing of the wafer W is finished. The wafer W is rotated at a relatively high speed of 1200 rpm in such a state that a downward air flow is formed by the fan filter unit 16 as set forth above. Therefore, the surrounding of the wafer W becomes a negative pressure atmosphere. The downward air flow is supplied to the central portion of the front surface of the wafer W through the opening 44 of the ring plate 41 and is drawn into a gap between the ring plate 41 and the wafer W. Thus, the air flow flows toward the peripheral edge portion of the wafer W. Since evacuation is performed through the exhaust pipe 28 existing below the wafer W, the air flow flowing to the peripheral edge portion of the wafer W is exhausted toward the lower side of the wafer W through the exhaust pipe 28.

Figure 5:
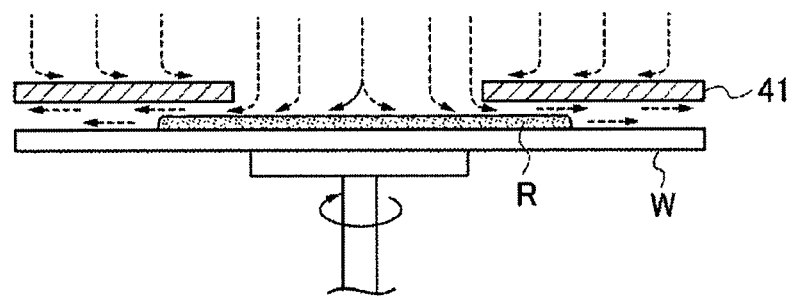
FIG. 5 is a process diagram of wafer processing performed by the resist coating apparatus.

The height of a flow path of the air flow moving from the central portion of the wafer W toward the peripheral edge portion thereof is limited by the lower surface of the ring plate 41. For that reason, the Reynolds number of the air flow passing below the lower surface of the ring plate 41 is suppressed to a small value. Thus, the air flow moving from the central portion of the front surface of the wafer W toward the peripheral edge portion thereof is a laminar flow or an air flow which can be regarded as a laminar flow. That is to say, the generation of a turbulent flow on the peripheral edge portion of the wafer W is suppressed. In FIG. 5, the air flow formed around the wafer W is indicated by dot-line arrows.

The resist R formed into the liquid pool is extended toward the peripheral edge portion of the wafer W by a centrifugal force generated due to the rotation of the wafer W. During this extension, the resist R is exposed to the air flow. The solvent contained in the resist R is volatized and the resist R is dried. By rotating the wafer W at a relatively high revolution number and suppressing the generation of a turbulent flow on the peripheral edge portion of the wafer W in this way, it is possible to increase the drying speed of the resist R and to prevent coating spots from being formed in the resist film by the turbulent flow.

Figure 6:
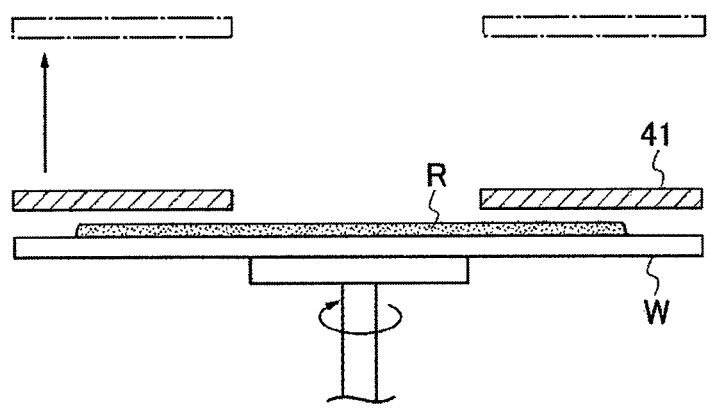
FIG. 6 is a process diagram of wafer processing performed by the resist coating apparatus.
Figure 7:
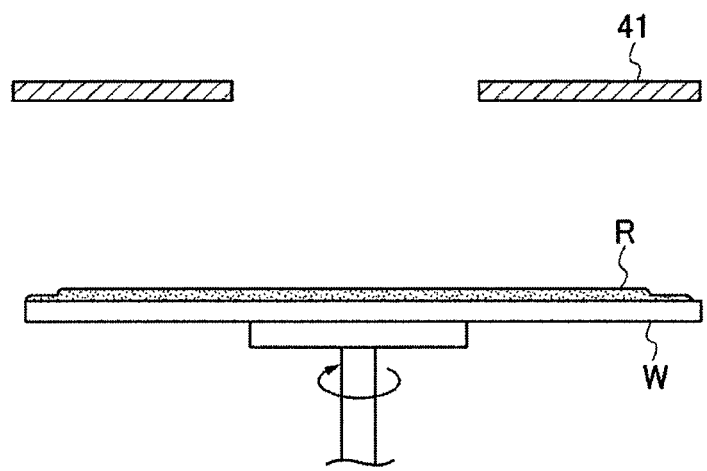
FIG. 7 is a process diagram of wafer processing performed by the resist coating apparatus.

After a lapse of a specified time from the time when the revolution number of the wafer W is increased, the revolution number of the wafer W is reduced to a predetermined revolution number and the ring plate 41 begins to move up from the processing position toward the retreated position (time t4 and FIG. 6). The reason for moving the ring plate 41 upward will be described later. Within an extent that the air flow flowing on the peripheral edge portion of the wafer W is prevented from becoming a turbulent flow even if the ring plate 41 is spaced apart from the processing position, the predetermined revolution number (third revolution number) may be set larger so as to suppress the reduction in the drying speed of the resist R. Specifically, the predetermined revolution number is, e.g., 800 rpm or less. In this example, the predetermined revolution number is set equal to 800 rpm.

The resist R is diffused to the peripheral edge portion of the wafer W, whereby the entirety of the wafer W is covered by the resist R. Then, the resist R is dried. In the meantime, the ring plate 41 is stopped upon reaching the retreated position (time t5 and FIG. 7). If, e.g., 1 second or more elapses from the time at which the ring plate 41 is stopped, the revolution number of the wafer W is reduced to a second revolution number of 50 rpm to 200 rpm, e.g., 100 rpm (time t6). The reason for reducing the revolution number of the wafer W after upward movement of the ring plate 41 stops is to reduce the revolution number after the turbulence of the air flow generated near the front surface of the wafer W due to the upward movement of the ring plate 41 has subsided. That is to say, the turbulence of the air flow becomes more violent if the revolution number is reduced before the turbulence of the air flow subsides. Consequently, coating spots are formed in the resist R. The reason for reducing the revolution number of the wafer W after the upward movement of the ring plate 41 stops is to suppress this phenomenon.

Figure 8:
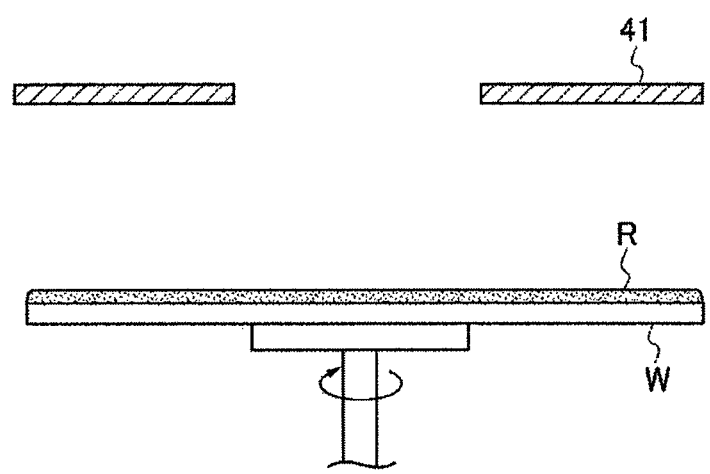
FIG. 8 is a process diagram of wafer processing performed by the resist coating apparatus.

As the wafer W continues to rotate at a relatively low revolution number of 100 rpm, the solid content contained in the resist R existing on the front surface of the wafer W is moved from the central portion of the wafer W toward the peripheral edge portion thereof by a centrifugal force. Thus, the relatively small film thickness in the peripheral end portion of the wafer W becomes gradually larger, whereby the uniformity of a film thickness distribution within the plane of the wafer W is increased (FIG. 8).

As can be noted in the evaluation tests to be described later, if the ring plate 41 is positioned at the processing position when the wafer W is rotated at a relatively low revolution number in order to adjust the film thickness distribution within the plane of the wafer W, a resist film is formed such that the film thickness becomes small in the peripheral end portion of the wafer W. Consequently, the uniformity of the film thickness distribution is decreased. The reason appears to be as follows. If the ring plate 41 stays in the processing position, the spaced-apart distance between the ring plate 41 and the wafer W is short. Therefore, the flow velocity of the air flow flowing on the front surface of the wafer W is relatively high. When exposed to air flow having a high flow velocity, the resist R is rapidly dried. As a result, the fluidity of the resist R is rapidly reduced. For that reason, the sufficient movement of the solid content contained in the resist R does not occur. In an effort to prevent this phenomenon, the ring plate 41 is move up from the processing position at time t4 as mentioned above.

Even when the ring plate 41 is positioned at the processing position at time t3 to t4 during which the resist R is extended on the wafer W and even when the air flow flowing near the front surface of the wafer W is stabilized by rotating the wafer W at a relatively high revolution number, if the revolution number of the wafer W is reduced to 100 rpm in this state in order to adjust the film thickness distribution, the amount of the air flow drawn onto the front surface of the wafer W from the opening 44 of the ring plate 41 is changed pursuant to the change in the revolution number. Thus, there is a fear that the air flow flowing near the front surface of the wafer W becomes turbulent. In order to prevent the air flow from becoming turbulent, prior to reducing the revolution number to 100 rpm as mentioned above, the ring plate 41 is moved to the retreated position where the air flow flowing near the front surface of the wafer W can be prevented from becoming a turbulent flow due to the reduction in the revolution number. In order to prevent the film thickness distribution from becoming uneven due to the retreatment of the ring plate 41, as described above with respect of the operation at time t4 to t5, the revolution number of the wafer W is reduced to 800 rpm in parallel with the retreatment of the ring plate 41.

Turning back to the description on the processing performed by the resist coating apparatus 1, the revolution number of the wafer W is increased to 800 rpm (time t7) after the wafer W is rotated at 100 rpm for a predetermined time. Thus, the resist R whose film thickness distribution has been adjusted is dried and forms a resist film on the wafer W. Thereafter, the rotation of the wafer W is stopped and the processing is finished. The wafer W is delivered from the spin chuck 11 to a transfer mechanism not shown and is transferred outside of the resist coating apparatus 1.

According to the resist coating apparatus 1, when the resist supplied from the resist nozzle 33 to the central portion of the wafer W is dried and extended to the peripheral edge portion of the wafer W, the ring plate 41 is positioned at the processing position such that the lower surface thereof comes closer to the wafer W, thereby straightening the air flow in the peripheral edge portion of the front surface of the wafer W. The wafer W is rotated at a relatively high revolution number such that drying is promoted. Thereafter, the ring plate 41 is moved from the processing position to the retreated position where the air flow flowing near the front surface of the wafer W is prevented from becoming turbulent due to the reduction in the revolution number of the wafer W. Then, the wafer W is rotated at a relatively low revolution number. Thus, the straightening action of the ring plate 41 does not work and the drying speed of the resist in the peripheral edge portion of the wafer W is reduced. In this state, the film thickness distribution within the plane of the wafer W is adjusted such that the film thickness in the peripheral edge portion increases.

Accordingly, it is possible to prevent the processing time of the wafer W from becoming longer and to prevent the uniformity of the film thickness distribution of the resist film within the plane of the wafer W from becoming lower.

Since the revolution number of the wafer W is reduced to 800 rpm in parallel with the movement of the ring plate 41 from the processing position, it is possible to reliably prevent the air flow from becoming turbulent in the peripheral edge portion of the front surface of the wafer W. Accordingly, it is possible to reliably suppress the reduction of the uniformity of the film thickness distribution of the resist film within the plane of the wafer W.

In the meantime, if the exhaust flow rate through the exhaust pipe 28 is increased in such a state that the ring plate 41 is positioned in the processing position, the amount of air flow drawn from the opening 44 of the ring plate 41 onto the front surface of the wafer W and then flowing toward the peripheral edge portion of the wafer W is increased. This makes it possible to reliably suppress generation of a turbulent flow on the peripheral edge portion of the wafer W. That is to say, by increasing the exhaust flow rate, it is possible to increase the upper limit of the revolution number of the wafer W which can be set so as to suppress generation of the turbulent flow at time t3 to t4.

The upper limit of the revolution number at which coating spots are not formed in the wafer W at time t3 to t4 of FIG. 9 varies depending on the type of the resist. In order to obtain a highly uniform film thickness, the exhaust flow rate is determined depending on the revolution number. Thus, the control unit 10 is configured to include data associated with the type of the resist, the revolution number of the wafer W at time t3 to t4 and the exhaust flow rate at time t3 to t4. The exhaust flow rate is stored as, e.g., the exhaust pressure of the exhaust pipe 28. Depending on the type of the resist supplied to the wafer W, the revolution number and the exhaust flow rate at time t3 to t4 may be determined based on the aforementioned data.

For example, when coating an arbitrary type of resist, just like the aforementioned embodiment, the resist coating apparatus 1 may be controlled such that, at time t3 to t4, the exhaust pressure of the exhaust pipe 28 becomes equal to 20 Pa and the revolution number of the wafer W becomes equal to 1200 rpm. When coating another type of resist, the resist coating apparatus 1 may be controlled such that, at time t3 to t4, the exhaust pressure of the exhaust pipe 28 and the revolution number of the wafer W become equal to 30 Pa and 1300 rpm, respectively, and after time t4, the exhaust pressure becomes equal to, e.g., 20 Pa, just like to aforementioned embodiment. As the revolution number of the wafer W at time t3 to t4 becomes larger, the drying speed of the resist is set higher. This makes it possible to enhance the throughput. The film thickness of the resist film may be adjusted by suitably adjusting the amount of the resist supplied to the wafer W and by controlling the drying speed of the resist film depending on the revolution number at time t3 to t4. That is to say, it is possible to form resist films having different film thicknesses using a resist having an arbitrary viscosity.

In the example described above, the reduction of the revolution number to 800 rpm and the start of the movement of the ring plate 41 toward the retreated position are simultaneously performed at time t4. However, insofar as coating spots are not formed in the resist film, the timing of the reduction of the revolution number and the timing of the start of the movement of the ring plate 41 may be staggered from each other.

Figure 10:
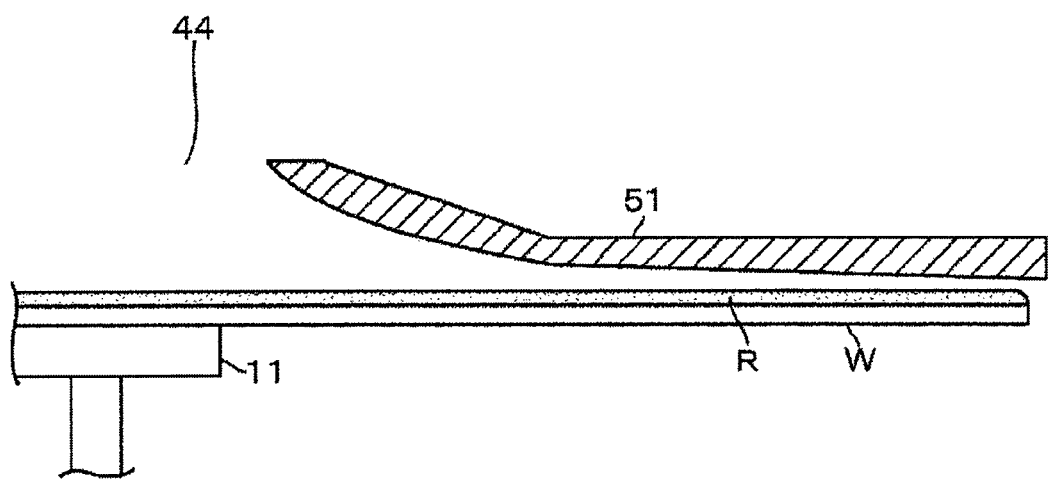
FIG. 10 is a vertical sectional view showing a modified example of the ring plate.

FIG. 10 shows a configuration example of another ring plate 51. When the lower surface of the ring plate 51 is seen in a vertical sectional view, the outer peripheral edge portion of the ring plate 51 is formed into a linear shape and the inner peripheral edge portion thereof is formed into a curved shape. The lower surface of the ring plate 51 is configured such that the distance between the lower surface of the ring plate 51 and the front surface of the wafer W becomes smaller toward the outer peripheral edge portion. This makes it possible to reduce the size of a flow path of the air flow in the outer peripheral edge portion of the wafer W and to reliably prevent the air flow from becoming turbulent.

In the ring plate 51, the distance between the lower surface of the ring plate 51 and the wafer W is larger in the central portion of the wafer W than in the peripheral edge portion thereof. Therefore, until the air flow entering the opening 44 and moving downward reaches the wafer W, the air flow is easily bent toward the peripheral edge portion of the wafer W by the centrifugal force of the wafer W and the evacuation. This suppresses the supply of a downwardly-moving air flow component to the wafer W. Accordingly, the resist R existing just below the peripheral edge portion of the opening 44 of the ring plate 51 is prevented from being rapidly dried by the downwardly-moving air flow component. As a result, the variation in the film thickness distribution of the resist film within the plane of the wafer W is surely prevented. In the case of using the ring plate 51 whose distance to the front surface of the wafer W is changed along a radial direction, the processing position is set at, e.g., a position where the spaced-apart distance between the portion of the lower surface of the ring plate 51 closest to the front surface of the wafer W and the front surface of the wafer W becomes equal to or smaller than 5 mm.

Figure 11:
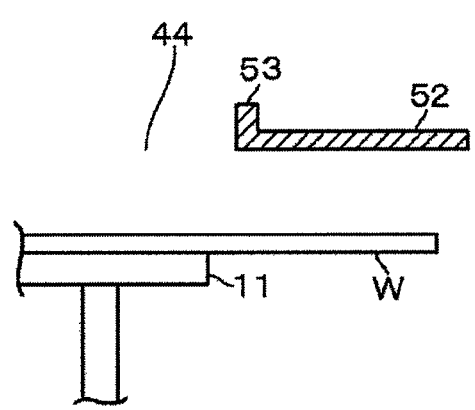
FIG. 11 is a vertical sectional view showing another modified example of the ring plate.

FIG. 11 shows a configuration example of another ring plate 52. The ring plate 52 includes a projection 53 formed in the upper surface of the inner peripheral edge portion of the ring plate 52 defining the peripheral edge portion of the opening 44. Due to the existence of the projection 53, the air flow moving from the opening 44 toward the wafer W first rides on the projection 53. Therefore, the air flow flowing just below the peripheral edge portion of the opening 44 is dispersed on the front surface of the wafer W. As a result, it is possible to suppress the reduction of the uniformity of the film thickness distribution within the plane of the wafer W. As shown in FIG. 11, the shape of the projection 53 is a square shape when seen in a cross section. Alternatively, the shape of the projection 53 may be a circular shape or a shape constituting a portion of an ellipse when seen in a cross section.

While description has been made on a case where the resist is used as the coating liquid, the present disclosure may be applied to a case where a chemical solution for forming an anti-reflection film or a chemical solution for forming an insulation film is coated on a substrate. Furthermore, the present disclosure may be applied to a case where an adhesive agent for bonding substrates together is coated on a substrate. The substrate is not limited to a circular substrate but may be a square substrate. The respective configurations of the ring plates described above may be combined with each other. As a material of each of the ring plates, it is possible to take an example in which the upper surface portion of the ring plate is made of a metal and the lower surface portion thereof is made of a resin or an example in which the entirety of the ring plate is made of a resin.

In the example described above, the ring plate 41 is moved up and down with respect to the wafer W. Alternatively, the resist coating apparatus 1 may be configured such that the height of the ring plate 41 is fixed during the processing of the wafer W and the spaced-apart distance between the wafer W and the ring plate 41 is changed by moving the spin chuck 11 up and down. In the example described above, the revolution number of the wafer W is reduced to 200 rpm in such a state that the ring plate 41 is stopped at the retreated position. Alternatively, if the ring plate 41 is moving upward through a region where the film thickness distribution is not affected, the revolution number of the wafer W may be reduced during the upward movement of the ring plate 41.

<Evaluation Tests>

Description will now be made on the evaluation tests conducted with respect to the present disclosure.

<Evaluation Test 1>

Figure 12:
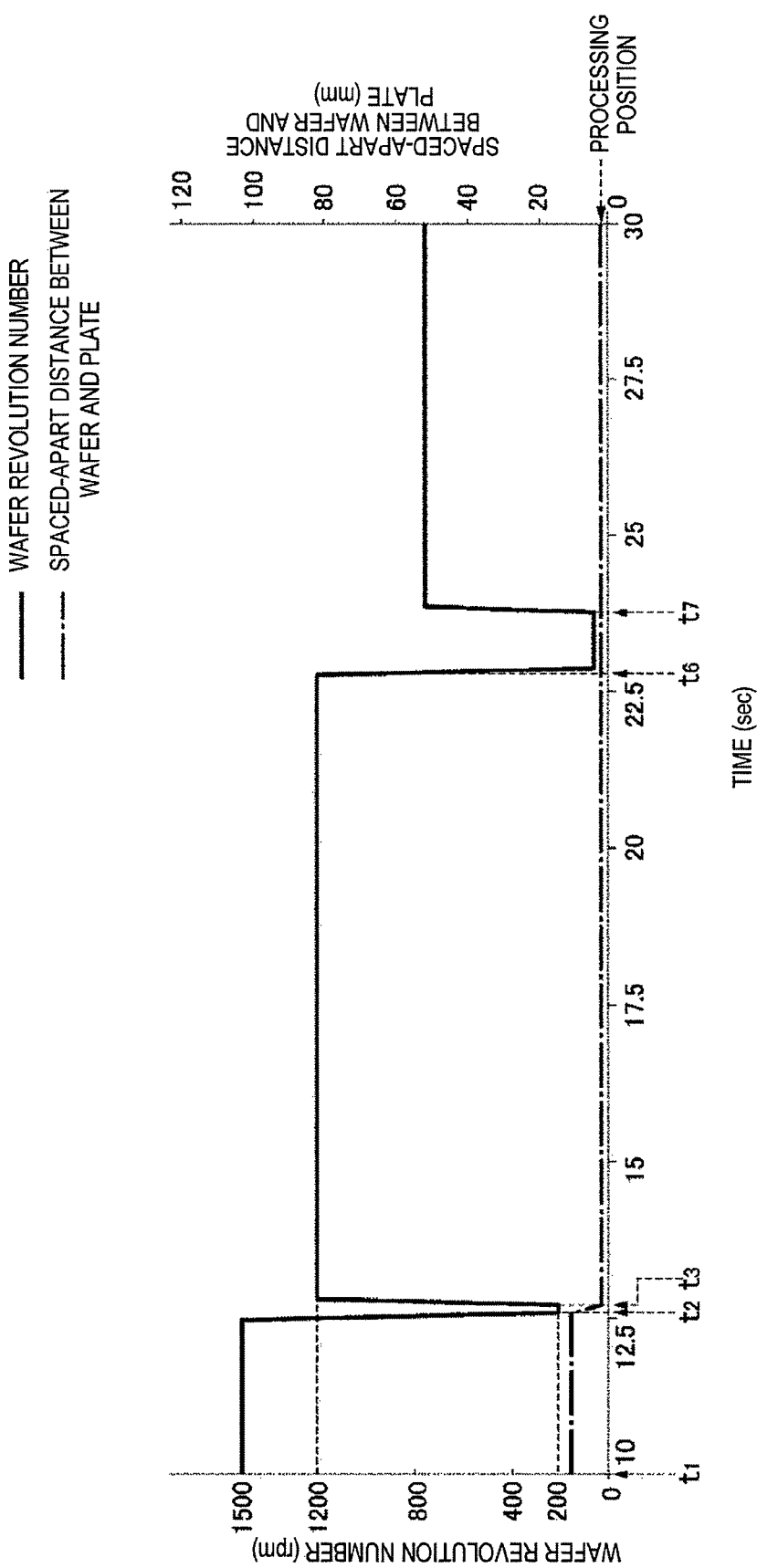
FIG. 12 is a time chart illustrating a change in the revolution number of a wafer and a change in the height of a ring plate during the wafer processing of a comparative example.

In Evaluation Test 1-1, a resist was coated on a wafer W having a diameter of 300 mm using a coating apparatus substantially identical with the aforementioned resist coating apparatus 1. A ring plate 41 is not installed in the coating apparatus used in Evaluation Test 1-1. The injection amount of the resist was set at 0.25 mL per one wafer W. When performing the processing, the revolution number of the wafer W was controlled like a graph indicated by a solid line in FIG. 12. The control of the revolution number was executed substantially in the same manner as in the aforementioned embodiment. As for the respective timings at which the revolution number is changed, symbols of time t1 to t3, t6 and t7 are indicated in the graph just like the aforementioned embodiment. In Evaluation Test 1-1, the reduction of the revolution number at time t4 of the aforementioned embodiment was not performed. The revolution number was increased at time t3, and after the revolution number reaches 1200 rpm, the revolution number was kept at 1200 rpm until time t6. At time t6, the revolution number was reduced to 200 rpm.

In Evaluation Test 1-2, the processing was performed by controlling the revolution number in a manner differing from Evaluation Test 1-1. More specifically, by setting the revolution number at 3000 rpm, a resist was supplied to the central portion of the wafer W and was diffused toward the peripheral edge portion of the wafer W. Subsequently, the supply of the resist was stopped, and by setting the revolution number at 100 rpm, the film thickness distribution was adjusted. Thereafter, the resist was dried by increasing the revolution number to 2000 rpm. The processing was performed under the same conditions as those of Evaluation Test 1-1 except that the revolution number is changed as above.

Figure 13:
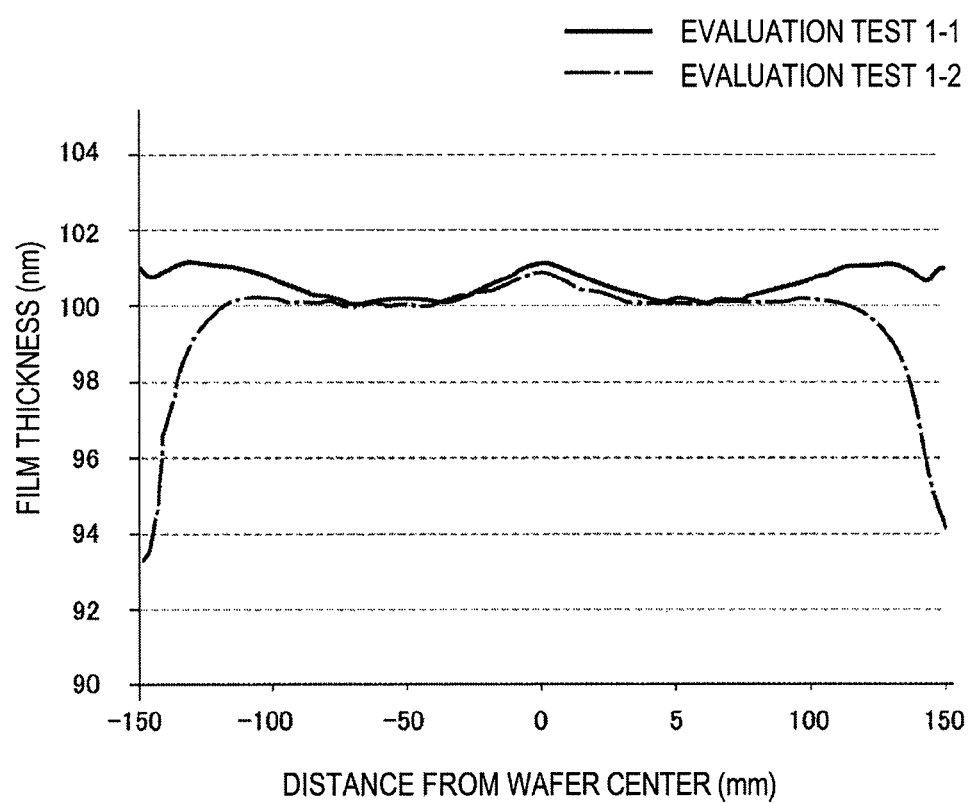
FIG. 13 is a graph illustrating film thickness distributions in evaluation tests.

The film thickness was measured along the diameter of each of the wafers W processed in Evaluation Tests 1-1 and 1-2. In a graph illustrated in FIG. 13, the film thickness distribution of the wafer W of Evaluation Test 1-1 is indicated by a solid line and the film thickness distribution of the wafer W of Evaluation Test 1-2 is indicated by a chain line. The vertical axis of the graph indicates the film thickness (unit: nm). The horizontal axis indicates the distance (unit: mm) from the center of the wafer W. As shown in FIG. 13, in the case of Evaluation Test 1-2, the film thickness is reduced toward the peripheral end portion of the wafer W in the distance ranges of 120 to 150 mm and −120 to −150 mm. In contrast, in the case of Evaluation Test 1-1, the reduction of the film thickness was not observed, and it can be noted that the uniformity of the film thickness is high.

<Evaluation Test 2>

In Evaluation Test 2-1, a wafer W having a diameter of 450 mm was processed using the aforementioned resist coating apparatus 1. The injection amount of the resist to the wafer W was set at 0.76 g. In Evaluation Test 2-1, the revolution number of the wafer W was controlled in the same manner as in Evaluation Test 1-1. That is to say, the revolution number was controlled as indicated by a graph in FIG. 12. The height of the ring plate 41 was controlled as indicated by the chain line in the graph of FIG. 12. More specifically, the height of the ring plate 41 differs from that of the aforementioned embodiment in that the ring plate 41 is positioned at the processing position and is kept at the processing position during the processing of the wafer W without moving the ring plate 41 to the retreated position.

In Evaluation Test 2-2, the processing was performed by controlling the revolution number of the wafer W in the same manner as in Evaluation Test 1-2. In Evaluation Test 2-2, just like Evaluation Test 1-2, the processing was performed using the resist coating apparatus in which the ring plate 41 is not installed. Other processing conditions remain the same as those of Evaluation Test 2-1.

Figure 14:
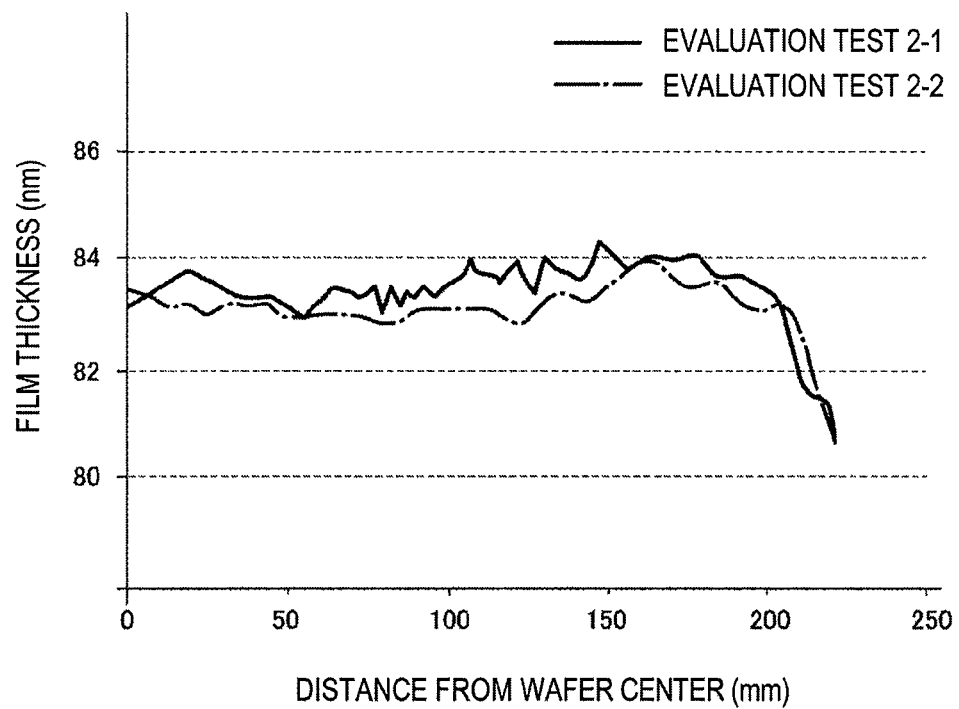
FIG. 14 is a graph illustrating film thickness distributions in evaluation tests.

The film thickness was measured along the radius of each of the wafers W processed in Evaluation Tests 2-1 and 2-2. As with the graph of FIG. 13, FIG. 14 shows the film thickness distributions of the wafers W of Evaluation Tests 2-1 and 2-2. The result of Evaluation Test 2-1 is indicated by a solid line and the result of Evaluation Test 2-2 is indicated by a chain line. This graph reveals that, in Evaluation Test 2-1, just like Evaluation Test 2-2, the film thickness is reduced in the peripheral edge portion of the wafer W. From the result of Evaluation Test 2-1 and the result of Evaluation Test 1-1, it can be noted that the film thickness distribution is not sufficiently adjusted because the ring plate 41 continues to be positioned at the processing position. Accordingly, it is effective that, when the film thickness distribution is adjusted, the ring plate 41 is moved to the retreated position as described in the embodiment.

<Evaluation Test 3>

In the same manner as in the aforementioned embodiment, a resist was coated on a plurality of wafers W. The exhaust pressure of the exhaust pipe 28 and the revolution number of the wafer W at times t3 to t4 were changed in every processing. With respect to the resist films of thus processed wafers W, the existence or absence of coating spots formed due to the transfer of a turbulent flow was investigated. Table 1 shown below indicates the result of Evaluation Test 3. In Table 1, the processing in which the coating spots were not observed is indicated by symbol O and the processing in which the coating spots were observed is indicated by symbol X.

TABLE 1

| | Revolution Number | | | | |
|---|---|---|---|---|---|
| Exhaust Pressure | 800 rpm | 1000 rpm | 1100 rpm | 1200 rpm | 1300 rpm |
| 20 Pa | O | O | O | X | X |
| 30 Pa | O | O | O | X | X |
| 40 Pa | O | O | O | O | X |

As shown in Table 1, when the exhaust pressure of the exhaust pipe 28 was set at 20 Pa and 30 Pa, the coating spots were not observed if the revolution number is 800 rpm, 1000 rpm and 1100 rpm but the coating spots were observed if the revolution number is 1200 rpm. When the exhaust pressure of the exhaust pipe 28 was set at 40 Pa, the coating spots were not observed at the revolution number of 1200 rpm as well as at the revolution numbers of 800 rpm, 1000 rpm and 1100 rpm. Accordingly, if the exhaust flow rate is increased, the drying speed of the resist can be made higher as described in the embodiment by increasing the revolution number at times t3 to t4.

According to the present disclosure, the coating liquid is diffused toward the peripheral edge portion of the substrate by rotating the substrate in a state in which the ring-shaped member is positioned at the processing position where the air flow flowing above the peripheral edge portion of the substrate is straightened. After the ring-shaped member is moved up to the retreated position where the air flow flowing near the front surface of the substrate is prevented from becoming turbulent due to the change in the revolution number of the substrate, the film thickness distribution is adjusted by reducing the revolution number of the substrate. With this configuration, even if the revolution number is increased when diffusing the coating liquid toward the peripheral edge portion of the substrate, it is possible to suppress generation of a turbulent flow on the peripheral edge portion of the substrate. When adjusting the film thickness distribution, it is possible to prevent the coating liquid from being dried in the peripheral edge portion of the substrate by the straightening action of the ring-shaped member before the film thickness distribution is sufficiently adjusted. As a result, it is possible to prevent the time required in forming the coating film from becoming longer and to suppress the reduction in the uniformity of the film thickness of the coating film within the plane of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A coating film forming method, comprising:

horizontally holding a substrate with a substrate holding unit;

positioning a ring-shaped member at a processing position where an air flow flowing above a peripheral edge portion of the substrate is straightened, the ring-shaped member annularly installed along a circumferential direction of the substrate so as to cover an upper side of the peripheral edge portion of the substrate;

supplying a coating liquid to a central portion of the substrate;

in a state in which the ring-shaped member is positioned at the processing position, rotating the substrate held in the substrate holding unit at a first revolution number by a rotating mechanism such that the coating liquid supplied to the central portion of the substrate is diffused toward the peripheral edge portion of the substrate by a centrifugal force;

bringing the ring-shaped member to a retreated position by moving the ring-shaped member upward from the processing position with respect to the substrate by an elevator mechanism, the retreated position being a position where an air flow flowing near a front surface of the substrate is prevented from becoming turbulent due to a change in the revolution number of the substrate; and reducing the revolution number of the substrate to a second revolution number lower than the first revolution number, wherein the method further comprising: in parallel with supplying the coating liquid to the substrate, rotating the substrate at a coating liquid supply revolution number; and then in parallel with stopping the supply of the coating liquid to the substrate, rotating the substrate at a liquid pool formation revolution number, the liquid pool formation revolution number being lower than the coating liquid supply revolution number, wherein rotating the substrate at a first revolution number is performed after rotating the substrate at a liquid pool formation revolution number;

wherein the method further comprising: in parallel with rotating the substrate at a first revolution number, evacuating the inside of a cup, which surrounds the substrate held in the substrate holding unit, at an exhaust flow rate associated with the first revolution number, wherein the first revolution number is changeable in a processing of a next substrate.

2. The coating film forming method of claim 1, wherein bringing the ring-shaped member to a retreated position is performed in parallel with rotating the substrate at a third revolution number lower than the first revolution number and higher than the second revolution number.

3. The coating film forming method of claim 2, wherein the substrate is a wafer having a diameter of 450 mm, and the third revolution number is a revolution number of 800 rpm or less.

4. The coating film forming method of claim 1, further comprising:

stopping the ring-shaped member moved to the retreated position, and wherein reducing the revolution number of the substrate to the second revolution number is performed after one second or more elapses from the stop of the ring-shaped member.

* * * * *